US012590998B2

(12) United States Patent
Boomer et al.

(10) Patent No.: US 12,590,998 B2
(45) Date of Patent: Mar. 31, 2026

(54) SYSTEM FOR ESTIMATING POWER DISSIPATION AND/OR EFFICIENCY

(71) Applicant: Cirrus Logic International Semiconductor Ltd., Edinburgh (GB)

(72) Inventors: Alastair M. Boomer, Edinburgh (GB); John B. Bowlerwell, Dunfermline (GB); Malcolm Blyth, Edinburgh (GB); Eric J. King, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 130 days.

(21) Appl. No.: 18/533,477

(22) Filed: Dec. 8, 2023

(65) Prior Publication Data

US 2024/0288477 A1    Aug. 29, 2024

Related U.S. Application Data

(60) Provisional application No. 63/440,942, filed on Jan. 25, 2023.

(30) Foreign Application Priority Data

Feb. 24, 2023    (GB) ...................................... 2302722

(51) Int. Cl.
*H02H 7/00* (2006.01)
*G01R 21/06* (2006.01)
(Continued)

(52) U.S. Cl.
CPC ......... *G01R 21/06* (2013.01); *G01R 31/2837* (2013.01); *H02H 7/20* (2013.01)

(58) Field of Classification Search
CPC ..................................................... G01R 21/06
See application file for complete search history.

(56) References Cited

U.S. PATENT DOCUMENTS 8,823,283 B2 * 9/2014 Kesterson .......... H05B 45/3725
315/308
9,599,520 B2 * 3/2017 Angeli ................... G01K 7/427
(Continued)

FOREIGN PATENT DOCUMENTS

WO        2023118783 A1      6/2023

OTHER PUBLICATIONS

Combined Search and Examination Report under Sections 17 and 18(3), UKIPO, Application No. GB2302722.0, mailed Aug. 25, 2023.

*Primary Examiner* — Stephen W Jackson
(74) *Attorney, Agent, or Firm* — Jackson Walker L.L.P.

(57) ABSTRACT

A system for estimating power dissipation in an integrated circuit comprising a power converter and an amplifier, the system comprising processing circuitry configured to: receive a signal indicative of an output voltage to a load which, in use of the integrated circuit, is driven by the amplifier; receive a signal indicative of an output current to the load; determine an output power value based on the received signal indicative of the output voltage to the load and the received signal indicative of the output current to the load; receive a signal indicative of an input voltage to the power converter; receive a signal indicative of an average current input to the power converter; determine an input power value based on the received signal indicative of the input voltage to the power converter and the received signal indicative of the average current input to the power converter; and determine a power dissipation value based on the determined output power value and the determined input power value.

22 Claims, 4 Drawing Sheets

(51) Int. Cl.
G01R 31/28 (2006.01)
H02H 7/20 (2006.01)

(56) References Cited

U.S. PATENT DOCUMENTS

| | | | |
|---|---|---|---|
| 2005/0219883 A1 | 10/2005 | Maple et al. | |
| 2006/0176046 A1* | 8/2006 | Walker | G01R 21/06 |
| | | | 324/142 |
| 2008/0278123 A1 | 11/2008 | Mehas et al. | |
| 2010/0320990 A1* | 12/2010 | Terdan | H03K 19/0008 |
| | | | 323/282 |
| 2015/0035504 A1 | 2/2015 | Lyle, Jr. | |
| 2020/0235712 A1 | 7/2020 | May | |
| 2021/0382095 A1* | 12/2021 | Wohlrab | G01R 15/18 |

* cited by examiner

SYSTEM FOR ESTIMATING POWER DISSIPATION AND/OR EFFICIENCY

FIELD OF THE INVENTION

The present disclosure relates to circuitry for estimating power dissipation and/or efficiency, and in particular to circuitry for estimating power dissipation and/or efficiency in an integrated circuit that comprises power converter circuitry and amplifier circuitry.

BACKGROUND

Portable devices such as mobile telephones, tablet and laptop computers and the like typically include amplifier circuitry for driving an audio output transducer such as a loudspeaker and/or a haptic output transducer to produce a desired acoustic or haptic output.

Specifically, to output sufficient power Pout to generate an acoustic output of a desired volume using an audio output transducer (e.g. a loudspeaker) of resistance Rspk, the RMS voltage supplied by the output of the amplifier circuitry to the audio output transducer must be $\sqrt{\text{Pout} \times \text{Rspk}}$. The supply voltage to the amplifier circuitry must have a degree of headroom above this peak output voltage to prevent distortion (e.g. caused by clipping) in the signal output by the amplifier circuitry.

Such portable devices are typically powered by one or more batteries or battery packs, which may not be able to supply the electrical power required to generate an audio or haptic output of a desired magnitude, e.g. an acoustic output of a desired volume. Thus, to provide the output power required to support the desired output magnitude, such portable devices may include power converter circuitry configured to convert a relatively low input voltage supplied by the battery or battery pack into a higher output voltage to supply the amplifier circuitry.

In some cases, the amplifier circuitry and the power converter circuitry are packaged in a single integrated circuit (IC) device (also referred to as a chip), e.g. on the same packaged semiconductor die. FIG. 1 is a schematic representation of such an IC device.

In the example illustrated in FIG. 1, an IC 100 includes power converter circuitry 110 and amplifier circuitry 120.

The power converter circuitry 110 has an input terminal for receiving a supply voltage at a first voltage magnitude VSup from a power supply such as a battery or battery pack of a portable device. The power converter circuitry 110 in this example comprises boost converter circuitry configured to output an output voltage at a second voltage magnitude VOut, which is greater than the first voltage magnitude VSup.

An output of the power converter circuitry 110 is coupled to a supply voltage input terminal of the amplifier circuitry 120, such that the amplifier circuitry 120 receives the output voltage at the second (increased) voltage magnitude VOut as its supply voltage.

An input terminal of the amplifier circuitry 120 receives an input signal Sin to be amplified, and output terminal are (in use of the IC 100) coupled to an output transducer 130 such as a loudspeaker, which is external to the IC 100.

Both the power converter circuitry 110 and the amplifier circuitry 120 operate with some level of inefficiency, and thus in use of the IC 100 both the power converter circuitry 110 and the amplifier circuitry 120 dissipate power as heat. As will be understood by those of ordinary skill in the art, this power dissipation increases the on-chip temperature of the IC 100 (i.e. the temperature of the semiconductor die), which could lead to issues such as reduced performance and, in extreme cases, thermal runaway. It is thus important to monitor and control the on-chip temperature to reduce the risk of such issues.

One approach to monitoring and controlling the on-chip temperature is to use one or more temperature sensors on or in close proximity to the IC 100 to monitor the temperature of the IC 100. If the temperature rises above a threshold, action can be initiated to reduce the on-chip temperature (or at least prevent or reduce any further increase in the on-chip temperature), e.g. by reducing the output voltage VOut of the power converter circuitry 110, reducing an operating frequency of the power converter circuitry 110, reducing a gain of the amplifier circuitry 120 or the like.

However, the effectiveness of temperature sensors is limited, as they only report the temperature in the vicinity of the sensor, whereas localised heating may be occurring elsewhere on the IC, such that the sensor may not detect a potentially damaging or dangerous temperature increase.

SUMMARY

According to a first aspect, the invention provides a system for estimating power dissipation in an integrated circuit comprising a power converter and an amplifier, the system comprising processing circuitry configured to:

receive a signal indicative of an output voltage to a load which, in use of the integrated circuit, is driven by the amplifier;

receive a signal indicative of an output current to the load;

determine an output power value based on the received signal indicative of the output voltage to the load and the received signal indicative of the output current to the load;

receive a signal indicative of an input voltage to the power converter;

receive a signal indicative of an average current input to the power converter;

determine an input power value based on the received signal indicative of the input voltage to the power converter and the received signal indicative of the average current input to the power converter; and determine a power dissipation value based on the determined output power value and the determined input power value.

The signal indicative of the output voltage to a load may be received from output voltage monitor circuitry of the integrated circuit, wherein the output voltage monitor circuitry is coupled to an output of the amplifier.

The signal indicative of the output current to the load may be received from output current monitor circuitry of the integrated circuit.

The output current monitor circuitry may be coupled to an output of the amplifier.

The system may further comprise:

output voltage monitor circuitry configured to be coupled to the amplifier or the load and to generate the signal indicative of the output voltage to the load; and output current monitor circuitry configured to be coupled to the amplifier or the load and to generate the signal indicative of the output current to the load.

The signal indicative of the input voltage to the power converter may be received from input voltage monitor circuitry of the integrated circuit.

The system may further comprise:

input voltage monitor circuitry configured to be coupled to the power converter and to generate the signal indicative of the input voltage to the power converter.

The processing circuitry may be configured to determine the power dissipation value by subtracting the output power value from the input power value.

The processing circuitry may be further configured to determine, estimate or predict a change in a temperature of the integrated circuit based on the power dissipation value and a junction to ambient thermal resistance value $\theta_{JA}$ of the integrated circuit.

The processing circuitry may be further configured to determine a final temperature of the IC based on the change in temperature and an initial temperature of the IC.

The processing circuitry may be further configured to compare the final temperature to a predefined temperature value and, responsive to a determination that the final temperature exceeds the predefined temperature value:
output a warning signal; or
adjust an operational parameter of the power converter; or
adjust an operational parameter of the amplifier; or
power down the power converter; or
power down the amplifier.

The processing circuitry may be further configured to compare the power dissipation value to a predetermined power dissipation threshold value and, responsive to a determination that the power dissipation value exceeds the predetermined power dissipation threshold value:
output a warning signal; or
adjust an operational parameter of the power converter; or
adjust an operational parameter of the amplifier; or
power down the power converter; or
power down the amplifier.

The processing circuitry may be configured to compare the power dissipation value to a first predetermined fault threshold and, responsive to a determination that the power dissipation value exceeds the first predetermined fault threshold:
output a warning signal; or
adjust an operational parameter of the power converter; or
adjust an operational parameter of the amplifier; or
power down the power converter; or
power down the amplifier.

The processing circuitry may be configured to compare a rate of change of the power dissipation value to a second predetermined fault threshold and, responsive to a determination that the rate of change of the power dissipation value exceeds the second predetermined fault threshold:
output a warning signal; or
adjust an operational parameter of the power converter; or
adjust an operational parameter of the amplifier; or
power down the power converter; or
power down the amplifier.

The processing circuitry may be further configured to determine an efficiency value based on the determined output power value and the determined input power value.

The processing circuitry may be configured to determine the efficiency value by dividing the output power value by the input power value.

The processing circuitry may be configured to compare the efficiency value to third predetermined fault threshold and, responsive to a determination that the efficiency value exceeds the third predetermined fault threshold:
output a warning signal; or
adjust an operational parameter of the power converter; or
adjust an operational parameter of the amplifier; or
power down the power converter; or

power down the amplifier.

The processing circuitry may be configured to compare a rate of change of the efficiency value to a fourth predetermined fault threshold and, responsive to a determination that the rate of change of the efficiency value exceeds the fourth predetermined fault threshold:
output a warning signal; or
adjust an operational parameter of the power converter; or
adjust an operational parameter of the amplifier; or
power down the power converter; or
power down the amplifier.

According to a second aspect, the invention provides a system for estimating an efficiency of an integrated circuit comprising a power converter and an amplifier, the system comprising processing circuitry configured to:
receive a signal indicative of an output voltage to a load which, in use of the integrated circuit, is driven by the amplifier;
receive a signal indicative of an output current to the load;
determine an output power value based on the received signal indicative of the output voltage to the load and the received signal indicative of the output current to the load;
receive a signal indicative of an input voltage to the power converter;
receive a signal indicative of an average current input to the power converter;
determine an input power value based on the received signal indicative of the input voltage to the power converter and the received signal indicative of the average current input to the power converter; and
determine an efficiency value based on the determined output power value and the determined input power value.

The amplifier may comprise Class D amplifier circuitry, Class G amplifier circuitry or Class H amplifier circuitry.

The power converter may comprise boost converter circuitry.

According to a third aspect, the invention provides an integrated circuit comprising a system according to the first aspect or the second aspect.

According to a fourth aspect, the invention provides a host device comprising a system according to the first aspect or the second aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

The present disclosure relates to a novel approach to estimating power dissipation in an integrated circuit that includes power converter circuitry and amplifier circuitry. A system level approach is taken to determine values (e.g. estimated values) for input power to the IC and output power from the IC, and these input power and output power values can be used to determine a power dissipation value and/or an efficiency value for the IC. These values may be used in a variety of applications, such as for real-time (or near real-time) monitoring of on-chip power dissipation, which may be used to detect potentially damaging or dangerous on-chip thermal conditions such as high temperatures or fast temperature changes.

Some amplifier systems (e.g. audio amplifier systems for driving an audio transducer such as a speaker or the like, or haptic amplifier systems for driving a haptic transducer such as a resonant actuator or the like) include voltage and current monitoring circuitry for monitoring a voltage across the transducer and a current through the transducer while it is being driven by an output signal from amplifier circuitry. The voltage and current monitoring circuitry may be provided as part of the amplifier circuitry (e.g. may be integrated with the amplifier circuitry on a single semiconductor die), or may be external to the amplifier circuitry (e.g. the current monitoring and voltage monitoring circuitry may be provided on a different semiconductor die or in a separate IC package).

Figure 1:
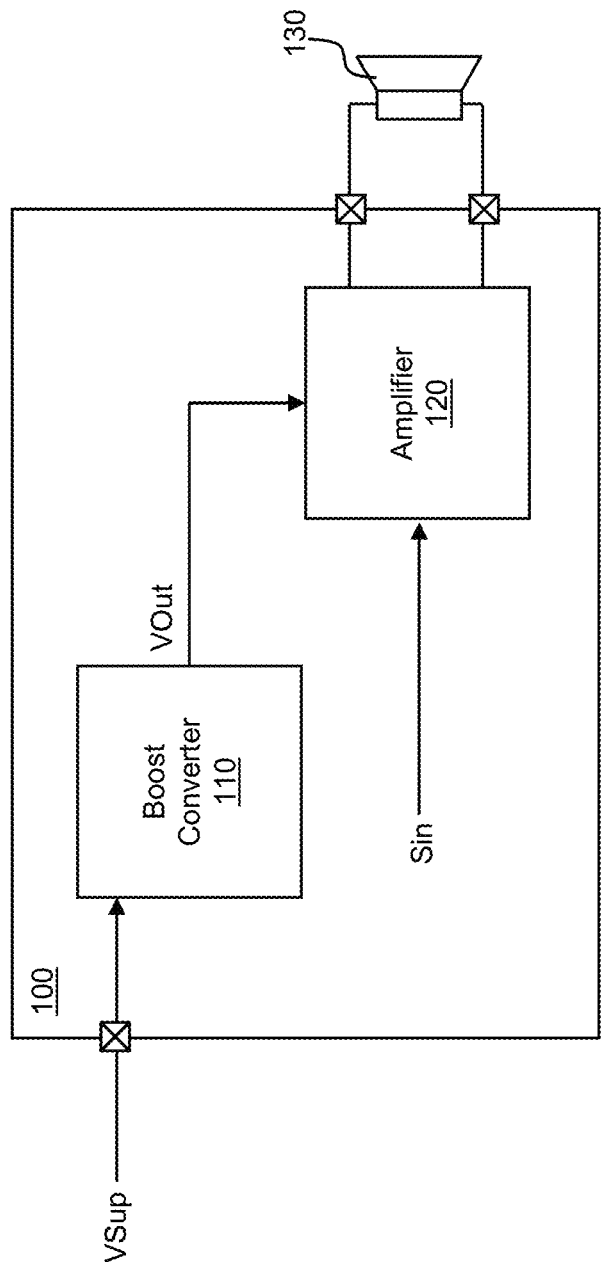
FIG. 1 is a schematic representation of an integrated circuit device including power converter circuitry and amplifier circuitry.
Figure 2:
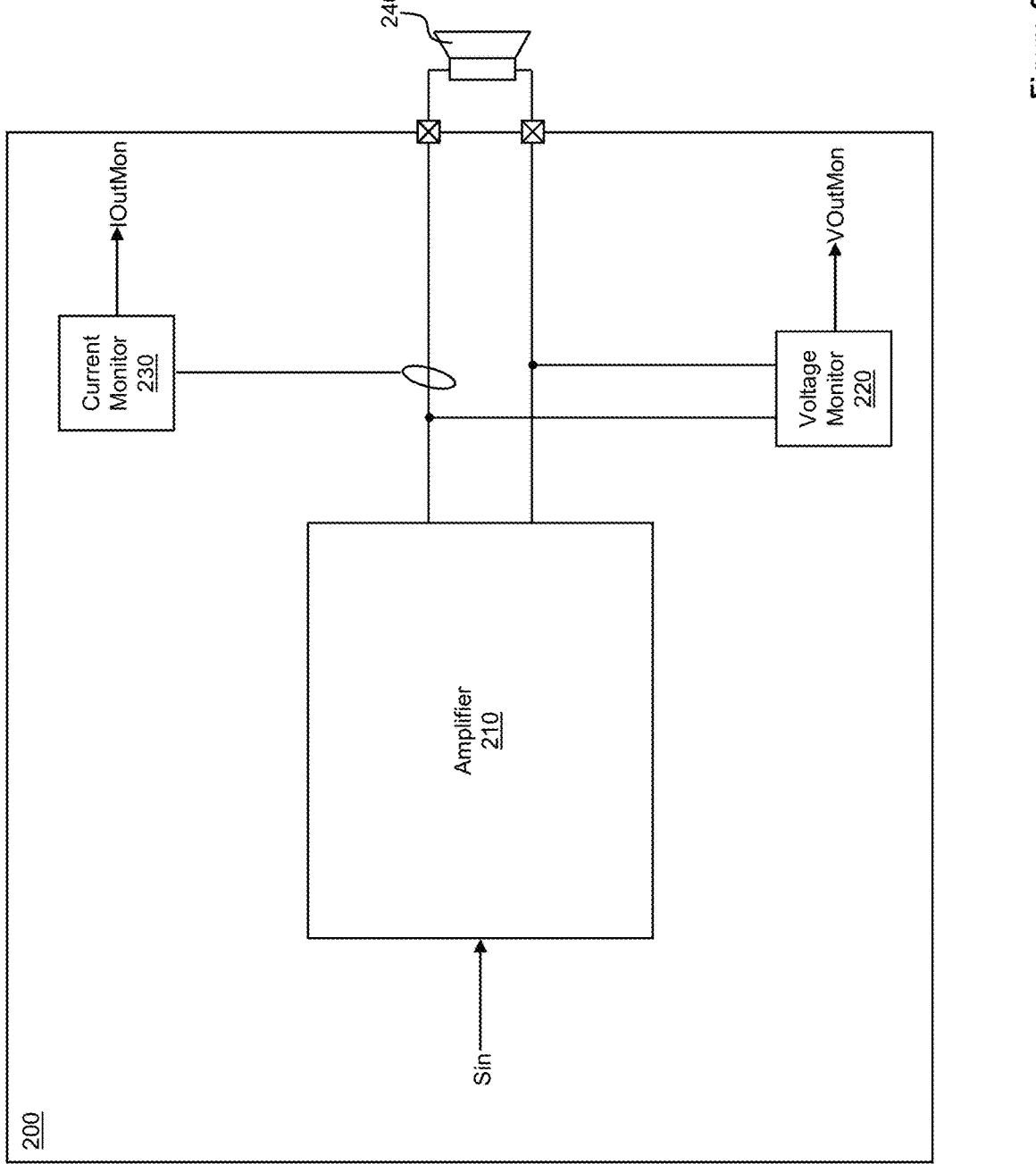
FIG. 2 is a schematic representation of an amplifier system that includes voltage and current monitor circuitry.

FIG. 2 is a schematic representation of an amplifier system that includes voltage and current monitoring circuitry. The amplifier system, shown generally at 200 in FIG. 2, includes amplifier circuitry 210, voltage monitor circuitry 220 coupled to output terminals of the amplifier circuitry 210, and current monitor circuitry 230 coupled to an output terminal of the amplifier circuitry 210.

The amplifier circuitry 210 is configured to receive an input signal Sin at an input terminal, and to output an amplified version of the input signal Sin as an output signal at its output terminals (which, in use of the amplifier system 200, are coupled to terminals of a load 240 such as a loudspeaker). The amplifier circuitry 210 may be, for example, Class D amplifier circuitry, Class G amplifier circuitry, Class H amplifier circuitry or any other amplifier circuitry that is suitable for the intended application of the amplifier system.

The voltage monitor circuitry 220 is configured to monitor the voltage across the load 240 and to output a signal VOutMon indicative of the voltage across the load 240. The voltage monitor circuitry 220 may comprise, for example, analog to digital converter (ADC) circuitry configured to generate a digital output signal representing the differential analog voltage between the output terminals of the amplifier circuitry 210.

The current monitor circuitry 230 is configured to monitor the current through the load 240 and to output a signal IOutMon indicative of the current through the load 240. The current monitor circuitry 230 may comprise, for example, a current sense resistor of known resistance coupled in series between an output terminal of the amplifier circuitry 210 and a terminal of the load 240 and ADC circuitry coupled across the current sense resistor such that a digital signal output by the ADC circuitry is representative of a voltage across the current sense resistor, which is in turn indicative of a current through the resistor and thus the current through the load 240.

Those of ordinary skill in the art will be familiar with other examples of suitable voltage and current monitor circuitry.

In applications where the amplifier system 200 drives an audio transducer such as a loudspeaker, the voltage monitor circuitry 220 and the current monitor circuitry 230 may be used in a speaker protection system which calculates speaker excursion and/or speaker coil temperature to prevent physical damage which could arise as a result of excessive output voltages or currents, or prolonged driving of the speaker with high voltages or currents.

In applications where the amplifier system 200 drives a haptic transducer such as a resonant actuator, the voltage monitor circuitry 220 and the current monitor circuitry 230 may be used in a displacement or position detection system which calculates the displacement of a moveable mass of the transducer from a reference position.

In the novel approach of the present disclosure, the voltage monitor circuitry 220 and the current monitor circuitry 230 provide the signals VOutMon, IOutMon representative of the output voltage and the output current (respectively), to processing circuitry, which uses the received signals to determine an output power value, as described below with reference to FIG. 4.

As described above, in order to ensure that amplifier circuitry is able to supply the necessary output power to support a desired output signal magnitude, it is commonplace for amplifier circuitry to receive a supply voltage from boost converter circuitry, which converts an input voltage received from a supply such as a battery or battery pack to a higher output voltage suitable for powering the amplifier circuitry.

Typically boost converter circuitry includes a control loop which controls a duty cycle of the boost converter circuitry based on a predefined peak current value for a current though an inductor or other energy storage component, such that the duty cycle depends on the time taken for the current through the energy storage component to reach the predefined peak current value during a charging phase of operation of the boost converter circuitry.

More recently, boost converter circuitry which uses average current control has been developed, as described in the applicant's U.S. provisional patent application No. 63/292,177, filed 21 Dec. 2021, UK patent application no. 2200734.8, filed 20 Jan. 2022, and International (PCT) application no. PCT/GB2022/053022, filed 29 Nov. 2022, all of which are incorporated herein in their entirety. Such boost converter circuitry regulates the current through an inductor (or other energy storage component) according to a predefined target average current value, and outputs a signal indicative of the average current through an energy storage component during an operational cycle of the boost converter circuitry.

Figure 3:
FIG. 3 is a schematic representation of a boost converter system with average current control and input voltage monitor circuitry.

FIG. 3 is a schematic representation of a boost converter system with average current control and voltage monitor circuitry.

The boost converter system, shown generally at 300 in FIG. 3, includes boost converter circuitry 310 of the kind described in the above-reference patent applications, which outputs a signal IAvg indicative of the average current through an energy storage component (and hence the average current input to the boost converter circuitry 310) during an operational cycle of the boost converter circuitry.

The boost converter system 300 further includes voltage monitor circuitry 320, which may comprise, for example, analog to digital converter (ADC) circuitry, configured to generate an output signal VinMon indicative of an input voltage to the boost converter circuitry 310.

The signal IAvg indicative of the average current through the energy storage component of the boost converter circuitry is typically used to regulate the average current through the energy storage component in accordance with a target average input current value, for example to prevent conditions in which an excessive amount of current is drawn from a battery or other power source.

In the novel approach of the present disclosure, the voltage monitor circuitry 320 and the boost converter circuitry 310 provide the signals VInMon, IAvg representative of the input voltage and the average input current (respectively) to processing circuitry, which uses the received signals to determine an input power value, as described below with reference to FIG. 4.

Figure 4:
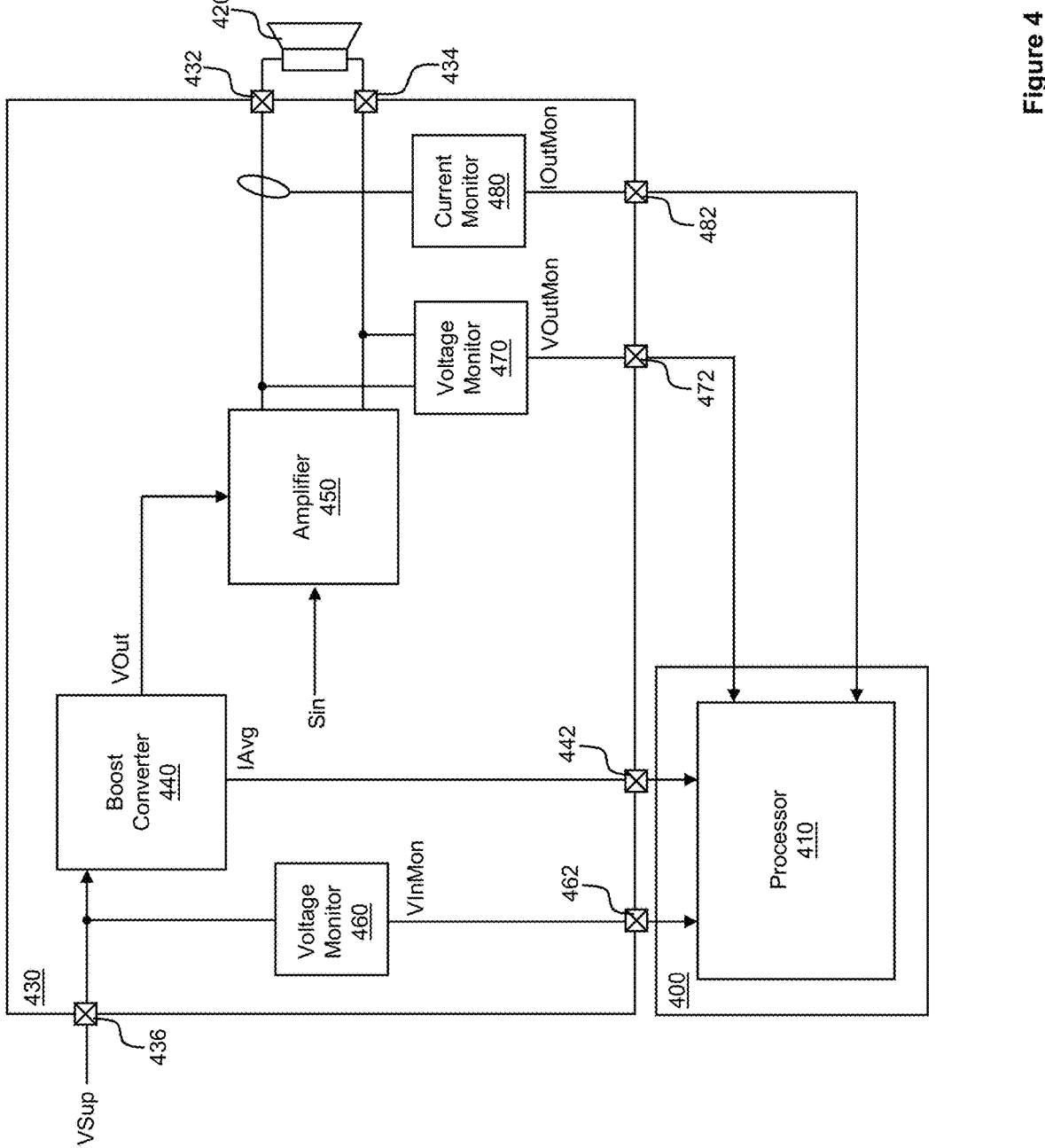
FIG. 4 is a schematic representation of a system including circuitry for monitoring power dissipation according to the present disclosure.

FIG. 4 is a schematic representation of a system for monitoring power dissipation and/or efficiency in an integrated circuit that includes a power converter and an amplifier according to the present disclosure.

The system, shown generally at 400 in FIG. 4, comprises processing circuitry 410 configured to receive a signal VOutMon indicative of a voltage across a load 420 which is coupled to first and second output terminals 432, 434 of an IC 430 that includes a power converter (in this example a boost converter) 440 and an amplifier 450. The processing circuitry 410 is further configured to receive a signal IOut-Mon indicative of a current through the load 420, a signal VInMon indicative of an input voltage to the boost converter 440 and a signal IAvg indicative of an average current through an energy storage component (and hence an average input current to the boost converter 440) during an operational cycle of the boost converter 440.

The processing circuitry 410 may comprise, for example, digital signal processor (DSP) circuitry, microprocessor or microcontroller circuitry executing suitable instructions or program code, or discrete circuitry configured to perform the processing functions and/or operations described below.

As shown in FIG. 4, an input of the boost converter 440 is coupled to an input terminal 436 of the IC 430. In use of the IC 430, the input terminal is coupled to a supply such as a battery or battery pack, external to the IC 430, which supplies an input voltage VSup to the IC430 via the input terminal 436.

The boost converter 440 is configured to receive the input voltage VSup and to generate an output voltage VOut which is greater than the input voltage VSup. An output terminal of the boost converter 440 is coupled to a power supply terminal of the amplifier 450, such that the output voltage VOut is supplied to the power supply terminal of the amplifier 450.

The amplifier 450 in this example is configured to receive an input signal Sin to be amplified, and to output an amplified version of the input signal as a differential output signal. First and second output terminals of the amplifier 450 are thus coupled to the first and second output terminals 432, 434 (respectively) of the IC 430, such that the differential output signal output by the amplifier 450 can be supplied, in use of the IC 430, to the load 420 to drive the load 420.

The signal VOutMon is received by the processing circuitry 410 from output voltage monitor circuitry 470, which has inputs that are coupled to the output terminals of the amplifier 450. The output voltage monitor circuitry 470 may comprise, for example, ADC circuitry configured to generate a digital output signal VOutMon representing a differential voltage between the output terminals of the amplifier 450.

In the example illustrated in FIG. 4, the output voltage monitor circuitry 470 is provided on the IC 430 as part of an amplifier system of the kind described above with reference to FIG. 2 (and thus can be regarded as pre-existing on-chip voltage monitor circuitry, in the sense that it would be present on the IC 430 even in the absence of the system 400 of the present disclosure), and its output terminal coupled to a dedicated contact (e.g. a pin, ball, pad or the like) 472 of the IC 430 such that the signal VOutMon is accessible to systems external to the IC 430, including the system 400 and other external systems such as a speaker protection system. Thus, the system 400 in this example is able to access the signal VOutMon for the purpose of estimating power dissipation, and therefore does not require any dedicated output voltage monitor circuitry of its own.

In other examples, however, the IC 430 may not include the output voltage monitor circuitry 470, which could instead be provided externally of the IC 430, e.g. as part of the system 400, or separately, in which case the inputs of the output voltage monitor circuitry 470 could be coupled to the output terminals 432, 434 of the IC 430.

The signal IOutMon is received by the processing circuitry 410 from output current monitor circuitry 480, which has an input that is coupled to an output terminal of the amplifier 450. The output current monitor circuitry 480 may comprise, for example a current sense resistor of known resistance coupled in series between the output of the amplifier and a terminal of the load 420 and ADC circuitry coupled across the current sense resistor such that a digital signal output by the ADC circuitry is representative of a voltage across the current sense resistor, which is in turn indicative of a current through the resistor and thus the current through the load 420.

In the example illustrated in FIG. 4, the output current monitor circuitry 480 is provided on the IC 430 as part of an amplifier system of the kind described above with reference to FIG. 2 (and thus can be regarded as pre-existing on-chip current monitor circuitry, in the sense that it would be present on the IC 430 even in the absence of the system 400 of the present disclosure), and its output terminal coupled to a dedicated contact (e.g. a pin, ball, pad or the like) 482 of the IC 430 such that the signal IOutMon is accessible to systems external to the IC 430, including the system 400 and other external systems such as a speaker protection system. Thus, the system 400 in this example is able to access the signal IOutMon for the purpose of estimating power dissipation, and therefore does not require any dedicated output current monitor circuitry of its own.

In other examples, however, the IC 430 may not include the output current monitor circuitry 480, which could instead be provided externally of the IC 430, e.g. as part of the system 400, or separately, in which case the input of the output current monitor circuitry 480 could be coupled to an output terminal 432, 434 of the IC 430.

The signal VInMon is received by the processing circuitry 410 from input voltage monitor circuitry 460, which has an input that is coupled to the input terminal 436 of the IC 430. The input voltage monitor circuitry 460 may comprise, for example, ADC circuitry configured to generate a digital output signal VInMon representing the voltage VSup received at the input terminal 436 from the external supply.

In the example illustrated in FIG. 4, the input voltage monitor circuitry 460 is provided on the IC 430 as part of a boost converter system of the kind described above with reference to FIG. 3 (and thus can be regarded as pre-existing on-chip input voltage monitor circuitry, in the sense that it would be present on the IC 430 even in the absence of the system 400 of the present disclosure), and its output terminal coupled to a dedicated contact (e.g. a pin, ball, pad or the like) 462 of the IC 430 such that the signal VInMon is accessible to systems external to the IC 430, including the system 400 and other external systems such as a speaker protection system. Thus, the system 400 in this example is able to access the signal VInMon for the purpose of estimating power dissipation, and therefore does not require any dedicated input voltage monitor circuitry of its own.

In other examples, however, the IC 430 may not include the input voltage monitor circuitry 460, which could instead be provided externally of the IC 430, e.g. as part of the system 400, or separately, in which case the input of the input voltage monitor circuitry 460 could be coupled to the input terminal 436 of the IC 430.

The signal IAvg is received by the processing circuitry 410 from the boost converter 440, via a dedicated contact (e.g. a pin, ball, pad or the like) 442 of the IC 430.

The processing circuitry 410 is configured to determine an output power value Pout based on the received signals VOutMon and IOutMon. The processing circuitry 410 is further configured to determine an input power value Pin based on the received signals VInMon and IAvg.

Specifically, the output power value Pout can be determined by the processing circuitry 410 by multiplying the voltage across the load 420 (as represented by the signal VOutMon) by the current through the load 420 (as represented by the signal IOutMon).

Similarly, the input power value Pin can be determined by the processing circuitry 410 by multiplying the input voltage to the boost converter 440 (as represented by the signal VInMon) by the average current through the energy storage component of the boost converter 440 (as represented by the signal IAvg).

Once the output power value Pout and the input power value Pin have been determined, the processing circuitry 410 can determine a power dissipation value, by subtracting the output power value Pout from the input power value Pin—i.e. Pdiss=Pin−Pout. The power dissipation value Pdiss provides an indication of the amount of power dissipated by the circuitry between the input terminal 436 and the output terminals 432, 434 of the IC 430.

As will be appreciated by those of ordinary skill in the art, the boost converter 440 and the amplifier 450 are the dominant sources of power dissipation on the IC 430, such that the power dissipation value Pdiss provides a good approximation of the amount of power dissipated by the circuitry on the IC 430 (i.e. the on-chip power dissipation)., which are the dominant sources of on-chip power dissipation.

Having determined the power dissipation value Pdiss, the processing circuitry 410 can use the determined power dissipation value for a number of purposes.

For example, the processing circuitry 410 may use the determined power dissipation value Pdiss to detect if a junction temperature of the IC will exceed a safe limit as a result of the on-chip power dissipation.

If the junction to ambient thermal resistance value Theta JA ($\theta_{JA}$) for the IC package is known, the processing circuitry 410 can estimate, determine or predict a temperature change of the IC package as a result of the power dissipation in the IC 430.

The junction to ambient thermal resistance value $\theta_{JA}$ is defined as the temperature differential between a junction of an IC and the ambient temperature per Watt of power dissipated. Thus, a change in junction temperature $\Delta Tj$ can be determined by the processing circuitry 410 by multiplying the power dissipation value Pdiss by the junction to ambient thermal resistance value $\theta_{JA}$, i.e. $\Delta Tj=Pdiss\times\theta_{JA}$. If the initial junction temperature Tj0 is known (e.g. from an on-chip sensor measurement), the final junction temperature resulting from the on-chip power dissipation can be estimated, determined or predicted by the processing circuitry by adding the change in junction temperature $\Delta Tj$ to the initial junction temperature Tj0, i.e. Tjfinal=Tj0+$\Delta Tj$.

The processing circuitry 410 (or a monitoring system external to the processing circuitry 410 which receives the power dissipation value Pdiss from the processing circuitry 410) may compare the estimated, predicted or determined final junction temperature to a predefined threshold junction temperature value to detect if there is a risk that the junction temperature will exceed a safe limit. If the estimated, predicted or determined final junction temperature exceeds the predefined threshold junction temperature value (indicating a risk that the junction temperature will exceed the safe limit), the processing circuitry 410 (or the external monitoring system) may output a warning signal, or may initiate corrective or protective action, e.g. powering down the amplifier 450 or the boost converter 440, or adjusting an operational parameter of the amplifier 450 (e.g. a gain of the amplifier 450) or an operational parameter of the boost converter 440 (e.g. a boost ratio of the boost converter 440) to reduce on-chip power dissipation and therefore reduce the increase in junction temperature to a safe level.

Additionally or alternatively, the processing circuitry 410 410 (or a monitoring system external to the processing circuitry 410 which receives the power dissipation value Pdiss from the processing circuitry 410) may compare the power dissipation value Pdiss to a predetermined power dissipation threshold value to determine if there is a risk of electromigration as a result of one or both of the boost converter 440 and the amplifier 450 leaving their safe operating area. If the power dissipation value Pdiss exceeds the predetermined power dissipation threshold value (indicating that one or both of the boost converter 440 and the amplifier 450 may have left their safe operating area), the processing circuitry 410 (or the external monitoring system) may output a warning signal, or may initiate corrective or protective action, e.g. powering down the amplifier 450 or the boost converter 440, or adjusting an operational parameter of the amplifier 450 (e.g. a gain of the amplifier 450) or an operational parameter of the boost converter 440 (e.g. a boost ratio of the boost converter 440) to reduce on-chip power dissipation and therefore reduce the increase in junction temperature to a safe level.

Additionally or alternatively, the processing circuitry 410 (or a monitoring system external to the processing circuitry 410 which receives the power dissipation value Pdiss from the processing circuitry 410) may monitor the power dissipation value Pdiss or a rate of change of the power dissipation value dPdiss/dt to detect a fault in the IC 430. For example, if the power dissipation value exceeds a first predetermined fault threshold or exceeds the first predetermined fault threshold for a predetermined period of time (indicating that there may be a fault in the IC 430), or if the rate of change dPdiss/dt exceeds a second predetermined fault threshold (again indicating that there may be a fault in the IC 430), the processing circuitry 410 (or the external monitoring system) may output a warning signal, or may take protective or corrective action as described above.

The processing circuitry 410 may, additionally or alternatively, determine an efficiency value for the IC 430, by dividing the output power value Pout by the input power Pin, i.e. Efficiency=Pout/Pin.

The determined efficiency value, or a rate of change of the determined efficiency value, may be used by the processing circuitry 410 (or a monitoring system external to the processing circuitry 410 which receives the determined efficiency value from the processing circuitry 410) to detect a fault in the IC 430. For example, if the efficiency value exceeds a third predetermined fault threshold or exceeds the third predetermined fault threshold for a predetermined period of time (indicating that there may be a fault in the IC 430), or if the rate of change of the determined efficiency value exceeds a fourth predetermined fault threshold (again indicating that there may be a fault in the IC 430), the processing circuitry 410 (or the external monitoring system) may output a warning signal, or may take protective or corrective action as described above.

As will be apparent from the foregoing description, the system of the present disclosure permits real-time (or near real-time) tracking of power dissipation and/or efficiency. In some examples, pre-existing voltage and current monitoring or reporting circuitry can be re-used to provide signals that can be used by the system to determine power dissipation and/or efficiency values. In other examples, minimal additional circuitry is required to generate signals that can be used by the system to determine the power consumption and/or efficiency value. The determined power dissipation and/or efficiency values can be used for a variety of purposes, including, for example, fault detection, maintaining an IC within safe operating temperature limits, and maintaining the circuits of an IC within their safe operating area to reduce the risk of electromigration.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)

programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A system for estimating power dissipation in an integrated circuit comprising a power converter and an amplifier, the system comprising processing circuitry configured to:

receive a signal indicative of an output voltage to a load which, in use of the integrated circuit, is driven by the amplifier;

receive a signal indicative of an output current to the load;

determine an output power value based on the received signal indicative of the output voltage to the load and the received signal indicative of the output current to the load;

receive a signal indicative of an input voltage to the power converter;

receive a signal indicative of an average current input to the power converter;

determine an input power value based on the received signal indicative of the input voltage to the power converter and the received signal indicative of the average current input to the power converter; and determine a power dissipation value based on the determined output power value and the determined input power value;

wherein:

the signal indicative of the output voltage to the load is received from output voltage monitor circuitry provided in the integrated circuit as part of the amplifier system; and the signal indicative of the output current to the load is received from output current monitor circuitry provided in the integrated circuit as part of the amplifier system.

2. A system according to claim 1, wherein:

the output voltage monitor circuitry is coupled to an output of the amplifier; and the output current monitor circuitry is coupled to an output of the amplifier.

3. A system according to claim 1, further comprising:

output voltage monitor circuitry configured to be coupled to the amplifier or the load and to generate the signal indicative of the output voltage to the load; and output current monitor circuitry configured to be coupled to the amplifier or the load and to generate the signal indicative of the output current to the load.

4. A system according to claim 1, wherein:

the signal indicative of the input voltage to the power converter is received from input voltage monitor circuitry of the integrated circuit.

5. A system according to claim 1, further comprising:

input voltage monitor circuitry configured to be coupled to the power converter and to generate the signal indicative of the input voltage to the power converter.

6. A system according to claim 1, wherein the processing circuitry is configured to determine the power dissipation value by subtracting the output power value from the input power value.

7. A system according to claim 1, wherein the processing circuitry is further configured to determine, estimate or predict a change in a temperature of the integrated circuit based on the power dissipation value and a junction to ambient thermal resistance value $\theta_{JA}$ of the integrated circuit.

8. A system according to claim 7, wherein the processing circuitry is further configured to determine a final temperature of the IC based on the change in temperature and an initial temperature of the IC.

9. A system according to claim 8, wherein the processing circuitry is further configured to compare the final temperature to a predefined temperature value and, responsive to a determination that the final temperature exceeds the predefined temperature value:

output a warning signal; or adjust an operational parameter of the power converter; or adjust an operational parameter of the amplifier; or power down the power converter; or power down the amplifier.

10. A system according to claim 1, wherein the processing circuitry is further configured to compare the power dissipation value to a predetermined power dissipation threshold value and, responsive to a determination that the power dissipation value exceeds the predetermined power dissipation threshold value:

output a warning signal; or adjust an operational parameter of the power converter; or adjust an operational parameter of the amplifier; or power down the power converter; or power down the amplifier.

11. A system according to claim 1, wherein the processing circuitry is configured to compare the power dissipation value to a first predetermined fault threshold and, responsive to a determination that the power dissipation value exceeds the first predetermined fault threshold:

output a warning signal; or adjust an operational parameter of the power converter; or adjust an operational parameter of the amplifier; or power down the power converter; or power down the amplifier.

12. A system according to claim 1, wherein the processing circuitry is configured to compare a rate of change of the power dissipation value to a second predetermined fault threshold and, responsive to a determination that the rate of change of the power dissipation value exceeds the second predetermined fault threshold:

output a warning signal; or adjust an operational parameter of the power converter; or adjust an operational parameter of the amplifier; or power down the power converter; or power down the amplifier.

13. A system according to claim 1, wherein the processing circuitry is further configured to determine an efficiency value based on the determined output power value and the determined input power value.

14. A system according to claim 13, wherein the processing circuitry is configured to determine the efficiency value by dividing the output power value by the input power value.

15. A system according to claim 13, wherein the processing circuitry is configured to compare the efficiency value to third predetermined fault threshold and, responsive to a determination that the efficiency value exceeds the third predetermined fault threshold:

output a warning signal; or adjust an operational parameter of the power converter; or adjust an operational parameter of the amplifier; or power down the power converter; or power down the amplifier.

16. A system according to claim 13, wherein the processing circuitry is configured to compare a rate of change of the efficiency value to a fourth predetermined fault threshold and, responsive to a determination that the rate of change of the efficiency value exceeds the fourth predetermined fault threshold:

output a warning signal; or adjust an operational parameter of the power converter; or adjust an operational parameter of the amplifier; or power down the power converter; or power down the amplifier.

17. A system for estimating an efficiency of an integrated circuit comprising a power converter and an amplifier, the system comprising processing circuitry configured to:

receive a signal indicative of an output voltage to a load which, in use of the integrated circuit, is driven by the amplifier;

receive a signal indicative of an output current to the load;

determine an output power value based on the received signal indicative of the output voltage to the load and the received signal indicative of the output current to the load;

receive a signal indicative of an input voltage to the power converter;

receive a signal indicative of an average current input to the power converter;

determine an input power value based on the received signal indicative of the input voltage to the power converter and the received signal indicative of the average current input to the power converter; and determine an efficiency value based on the determined output power value and the determined input power value;

wherein:

the signal indicative of the output voltage to the load is received from output voltage monitor circuitry provided in the integrated circuit as part of the amplifier system; and the signal indicative of the output current to the load is received from output current monitor circuitry provided in the integrated circuit as part of the amplifier system.

18. A system according to claim 1, wherein the amplifier comprises Class D amplifier circuitry, Class G amplifier circuitry or Class H amplifier circuitry.

19. A system according to claim 1, wherein the power converter comprises boost converter circuitry.

20. An integrated circuit comprising a system according to claim 1.

21. A host device comprising a system according to claim 1.

22. A host device according to claim 21, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

* * * * *